US012622095B2

(12) United States Patent
Matthesius et al.

(10) Patent No.: US 12,622,095 B2
(45) Date of Patent: May 5, 2026

(54) OPTICAL DEVICE AND METHOD FOR PRODUCING AN OPTICAL DEVICE

(71) Applicant: JENOPTIK Optical Systems GmbH, Jena (DE)

(72) Inventors: Daniel Matthesius, Eichwalde (DE); Torsten Trenkler, Berlin (DE); Enrico Pertzsch, Schoenfeld (DE)

(73) Assignee: Jenoptik Optical Systems GmbH, Jena (DE)

( * ) Notice: Subject to any disclaimer, the term of this patent is extended or adjusted under 35 U.S.C. 154(b) by 615 days.

(21) Appl. No.: 18/015,161

(22) PCT Filed: Jul. 7, 2021

(86) PCT No.: PCT/EP2021/068735
§ 371 (c)(1),
(2) Date: May 9, 2023

(87) PCT Pub. No.: WO2022/008551
PCT Pub. Date: Jan. 13, 2022

(65) Prior Publication Data
US 2023/0268455 A1 Aug. 24, 2023

(30) Foreign Application Priority Data
Jul. 10, 2020 (DE) ..................... 10 2020 118 260.0

(51) Int. Cl.
*H10H 20/01* (2025.01)
*H01L 25/075* (2006.01)
*H10H 20/84* (2025.01)

(52) U.S. Cl.
CPC ... *H10H 20/01335* (2025.01); *H01L 25/0753* (2013.01); *H10H 20/84* (2025.01); *H10H 20/034* (2025.01)

(58) Field of Classification Search
None
See application file for complete search history.

(56) References Cited

U.S. PATENT DOCUMENTS 9,123,607 B1* 9/2015 Hatcher .............. H10F 39/1843
9,368,700 B2 6/2016 Jerebic et al.
(Continued)

FOREIGN PATENT DOCUMENTS

DE 10 2011 079 403 A1 1/2013
DE 10 2015 112 042 A1 1/2017
(Continued)

OTHER PUBLICATIONS

International Search Report for PCT Application No. PCt/EP2021/068735 dated Oct. 19, 2021 with English translation.
(Continued)

*Primary Examiner* — Bilkis Jahan
(74) *Attorney, Agent, or Firm* — Muncy, Geissler, Olds & Lowe, P.C.

(57) ABSTRACT

The invention relates to a method for producing an optical apparatus (200). The method comprises a step of providing a substrate (210) on whose first main surface (212) a plurality of emission devices (220) for emitting electromagnetic radiation (250, 255) are arranged. The substrate (210) is designed as a light-emitting diode wafer and/or formed from sapphire or gallium nitride and is transparent at least for one emission wavelength of the radiation (250, 255) emitted by the emission devices (220), The method also comprises a step of applying an absorption material (230) on the side of the first main surface (212) of the substrate (210). The absorption material (230) has a photostructurable resist that absorbs at least the emission wavelength. The method further comprises a step of processing the absorbing material (230) in order to lay bare at least one emission surface (227) of each emission device (220). In this case, a position (Continued)

determination of surfaces to be laid bare is carried out from a second main surface (214) of the substrate (210) opposite the first main surface (212). In addition, the method comprises a step of singulating the substrate (210) into a plurality of optical apparatuses (200) by means of a separating manufacturing process, wherein each optical apparatus (200) has at least one emission device (220).

7 Claims, 3 Drawing Sheets

(56)                References Cited

U.S. PATENT DOCUMENTS

| 10,079,160 | B1 | 9/2018 | Margomenos et al. |
| 10,418,515 | B2 | 9/2019 | Wicke et al. |
| 10,763,245 | B2 | 9/2020 | Haiberger et al. |
| 11,024,666 | B2 * | 6/2021 | Von Känel ............... H10F 39/18 |
| 2010/0133564 | A1 * | 6/2010 | Herrmann ........... H01L 21/6835 |
| | | | 438/22 |
| 2011/0298000 | A1 | 12/2011 | Liu et al. |
| 2014/0217436 | A1 | 8/2014 | Hussell et al. |
| 2015/0035143 | A1 | 2/2015 | Lin |
| 2015/0295142 | A1 | 10/2015 | Huang et al. |
| 2016/0230017 | A1 * | 8/2016 | Woolf ...................... C09D 7/62 |
| 2016/0293811 | A1 | 10/2016 | Hussell et al. |

FOREIGN PATENT DOCUMENTS

| DE | 10 2016 119 002 A1 | 4/2018 |
| WO | WO 2012/164456 A1 | 12/2012 |

OTHER PUBLICATIONS

Karl Suss, "Backside and Topside Alignment," at www.youtube/watch?v=yZgxPg0FFs 5.558 Aufrufe (Mar. 25, 2014).

* cited by examiner

OPTICAL DEVICE AND METHOD FOR PRODUCING AN OPTICAL DEVICE

The invention relates to a method for producing an optical apparatus, in particular for producing an optical sight, in particular a reflector sight, with at least one such optical apparatus. It furthermore relates to an optical apparatus and to an optical sight, in particular a reflector sight.

There are currently various methods for suppressing secondary light-emission in optical apparatuses. For example, miniaturized metal masks can be used to cover regions of an LED chip. An absorbing layer can also be applied, for example, to a rear side of transparent substrates. For example, small, black plastic caps can also be used to cover a chip and bonding wires and thus absorb part of unwanted reflections.

Document US 2011/0 298 000 A1 discloses a chip packaging process which can be used to produce optical apparatuses, in particular LED chips.

Against this background, with the approach presented here, a method for producing an optical apparatus, an optical apparatus and an optical sight, in particular a reflector sight, with at least one such optical apparatus according to the main claims is presented. Advantageous configurations and developments of the invention are evident from the following dependent claims.

According to embodiments, an optical apparatus can be provided in particular, during the production of which all regions of the apparatus that are no longer accessed in the further production method and/or that only allow secondary light emission to emerge can be covered in a radiation-absorbing manner in order to eliminate or at least minimize unwanted secondary light emission. The covering with an absorption material can be carried out in particular during the chip process at the wafer level in order to process a plurality or multiplicity of components in one processing step in a cost-effective manner. In other words, for example, an optical apparatus can be provided with an absorption layer that is photostructurable at the wafer level to prevent unwanted secondary light emission due to reflection and/or light guidance in the transparent substrate or in epitaxial layers.

Advantageously, according to embodiments, undesired or unwanted secondary light emission in particular can be minimized or completely eliminated in an optical apparatus. A plurality of apparatuses, for example up to several thousand apparatuses, can be processed in one step. A contact grid can be present in particular in the case of standard chips, which would also remain visible when using a conventional metal mask as absorption covering and is undesirable, which can be avoided according to embodiments. The absorption material, for example a resist, can also act as a barrier for subsequent black potting of bonding wires and substrate edges or chip edges.

For example, for reflector sights and similar applications, according to embodiments, optical apparatuses can be provided as LED point emitters and LED displays with precisely defined light-emitting surfaces. Secondary light emission outside of intended light-emitting surfaces which is perceivable by the user can be suppressed or reduced to a minimum. Secondary light emission can arise from a wide variety of causes, for example reflection at metal edges of the apparatus or on the LED chip, imprecise definition of light-emitting surfaces, light guidance through transparent layers and substrates or the like. The production according to embodiments is suitable in particular for point emitters and display chips on transparent substrates, since the absorption material can be precisely applied to cover all chip-level regions where secondary light emission can occur and which no longer needs to be accessed in the subsequent build-up process. Furthermore, the apparatuses can be protected from a die singulation process. In addition, the apparatus is inexpensive to produce since all apparatuses can already be finished and protected at the wafer level.

A method for producing an optical apparatus is presented, the method having the following steps:

providing a substrate on whose first main surface a plurality of emission devices for emitting electromagnetic radiation are arranged, wherein the substrate is transparent at least for one emission wavelength of the radiation emitted by the emission devices;

applying an absorption material on the side of the first main surface of the substrate, wherein the absorption material absorbs at least one emission wavelength;

processing the absorption material to lay bare at least one emission surface of each emission device, wherein a position determination of surfaces to be laid bare is carried out from a second main surface of the substrate opposite the first main surface; and singulating the substrate into a plurality of optical apparatuses by means of a separating manufacturing process, wherein each optical apparatus has at least one emission device.

According to the invention, the substrate in the method is designed as a light-emitting diode wafer and/or is formed from sapphire or gallium nitride. Furthermore, the absorption material has, according to the invention, a photostructurable resist that absorbs at least the emission wavelength.

Electromagnetic radiation can be understood to mean, for example, light emission that is emitted, for example, by a light source or a laser source as the radiation source. In other words, the electromagnetic radiation may include light in the spectrum visible to humans and/or radiation in the invisible spectrum. At least one of the emission devices can be designed as a light-emitting diode (LED). The apparatus can be an LED chip. The apparatus can act, for example, as an LED point emitter or as an LED display. In the singulating step, the substrate can be singulated into a multiplicity of optical apparatuses, for example more than ten, more than 100, or more than 1000 apparatuses. Each optical apparatus may have at least one emission device and a portion of the substrate. At least one further component, for example an electrical, electronic and/or optical component, can be arranged on the first main surface of the substrate. The position determination of the absorption layer can be carried out by means of rear-side adjustment.

In the processing step, the absorption material can also be exposed using a photomask, developed using a developer material, and thus removed at least in the region of the at least one emission surface. For example, ultraviolet light can be used for the exposure. The exposure can be carried out for an exposure time of, for example, 10 seconds. The photomask can be aligned based on the position determination, Such an embodiment offers the advantage that the absorption material can be processed in a simple and precise manner using established processes.

Furthermore, in the processing step, the absorption material can be processed in order to lay bare electrical connection surfaces of each emission device and additionally or alternatively at least one singulation boundary. In the singulating step, the substrate can be separated into the plurality of optical apparatuses along the at least one singulation boundary. Such an embodiment offers the advantage that the absorption material can be removed in a simple manner from regions that are required to be bare on the side of the first main surface of the substrate.

According to one embodiment, in the providing step, a substrate can be provided on whose second main surface adjustment marks for the position determination are created. Alternatively, the method can have a step of creating adjustment marks for the position determination on the second main surface of the substrate. The creating step may be performed before the processing step. Such an embodiment offers the advantage that precise, reliable and uncomplicated position determination can be made possible in order to lay bare precisely defined surfaces of the absorption material.

In the providing step, a substrate can also be provided whose second main surface is polished. Alternatively, the method may include a step of polishing the second main surface of the substrate. The polishing step may be performed before the processing step. Such an embodiment offers the advantage that an exact position determination is made possible, wherein elements on the first main surface can be detected easily and reliably through the substrate.

In addition, after the step of singulating the substrate, the method can include a step of potting side edges of the substrate of each optical apparatus using a potting material. In this case, the potting material can absorb at least the emission wavelength. Such an embodiment offers the advantage that undesired secondary light emission can be further reduced in a simple manner, wherein it is additionally possible to achieve or aid encasing of the apparatus.

In particular, a substrate can be provided in the providing step, which is designed as a light-emitting diode wafer and thus comprises an active layer based on electroluminescence and is additionally or alternatively formed from sapphire or gallium nitride. Additionally or alternatively, an absorption material can be applied in the application step, which comprises a colored resist, in particular a solder resist known from the production of circuit boards and, additionally or alternatively, photostructurable resist. Such an embodiment offers the advantage that an inexpensive optical apparatus can be provided, whereby undesired secondary light emission can be minimized.

For example, in the providing step, a substrate with emission devices that are manufactured using a semiconductor-technological process can be provided. Alternatively, the method can include a step of manufacturing the emission devices on the substrate by means of a semiconductor-technological process. In the semiconductor-technological process, an n-doped epitaxial layer can be arranged on the first main surface of the substrate, an n-contact metal can be arranged as a first electrical connection surface and an active emission layer can be arranged on the n-doped epitaxial layer, the active emission layer can be covered with a p-doped epitaxial layer, and a p-contact metal can be arranged as a second electrical connection surface on the p-doped epitaxial layer. Such an embodiment offers the advantage that well-established and tested processes can be used to manufacture at least the emission devices on the substrate in a cost-effective and precise manner.

Also presented is an optical apparatus which has the following features:

at least one emission device for emitting electromagnetic radiation;

a substrate on whose first main surface at least one emission device is arranged, wherein the substrate is designed as a light-emitting diode wafer and/or is formed from sapphire or gallium nitride and is transparent at least for an emission wavelength of the radiation emitted by the at least one emission device; and an absorption material applied on the side of the first main surface of the substrate, wherein the absorption material has a photostructurable resist which absorbs at least the emission wavelength, wherein at least one emission surface of the at least one emission device is freed from the absorption material.

The optical apparatus may be, or may have been, manufactured by carrying out an embodiment of the above-stated method. In particular, an optical sight, in particular a reflector sight, with at least one example of an embodiment of such an optical apparatus can be, or can have been, produced in this way.

In connection with the optical sight, at least one piece of an embodiment of the above-stated optical apparatus can advantageously be employed or used as a radiation source, light source and/or image source.

An exemplary embodiment of the invention is shown purely schematically in the drawings and is described in more detail below. In the drawings, FIG. 1 shows a schematic illustration of an optical apparatus that is producible using the method;

In the following description of beneficial exemplary embodiments of the present invention, identical or similar reference signs are used for the elements of similar action which are illustrated in the various figures, wherein a repeated description of these elements is omitted.

Figure 1:
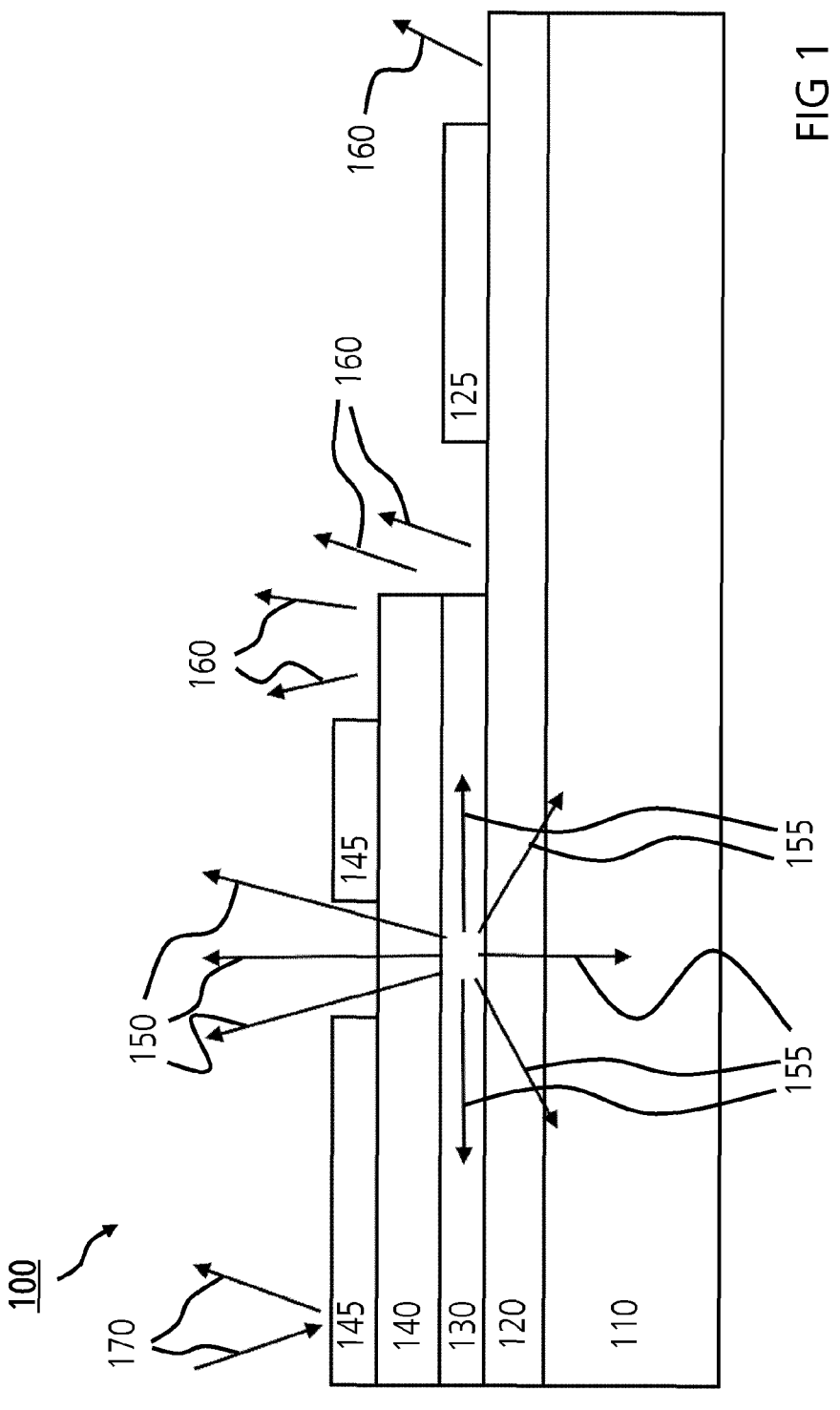

FIG. 1 shows a schematic illustration of an optical apparatus 100. The optical apparatus 100 is designed, for example, as a light-emitting diode chip, or LED chip. The apparatus 100 comprises a substrate 110 formed from a transparent material, for example sapphire, gallium nitride or the like, furthermore an n-doped epitaxial layer 120, an n-contact metal 125, an active region 130, a p-doped epitaxial layer 140, and a p-contact metal 145. The electromagnetic radiation, here for example light, is generated in the active region 130. Direct light 150 of the active region 130 that is as intended here exits the apparatus 100 at a surface provided for this purpose. Unwanted direct light 155 of the active region 130 exits the apparatus 100 at other surfaces. Stray light 160 likewise exits the apparatus 100. Furthermore, a reflection of external stray light 170 at the p-contact metal 145 by way of example is shown.

Figure 2:
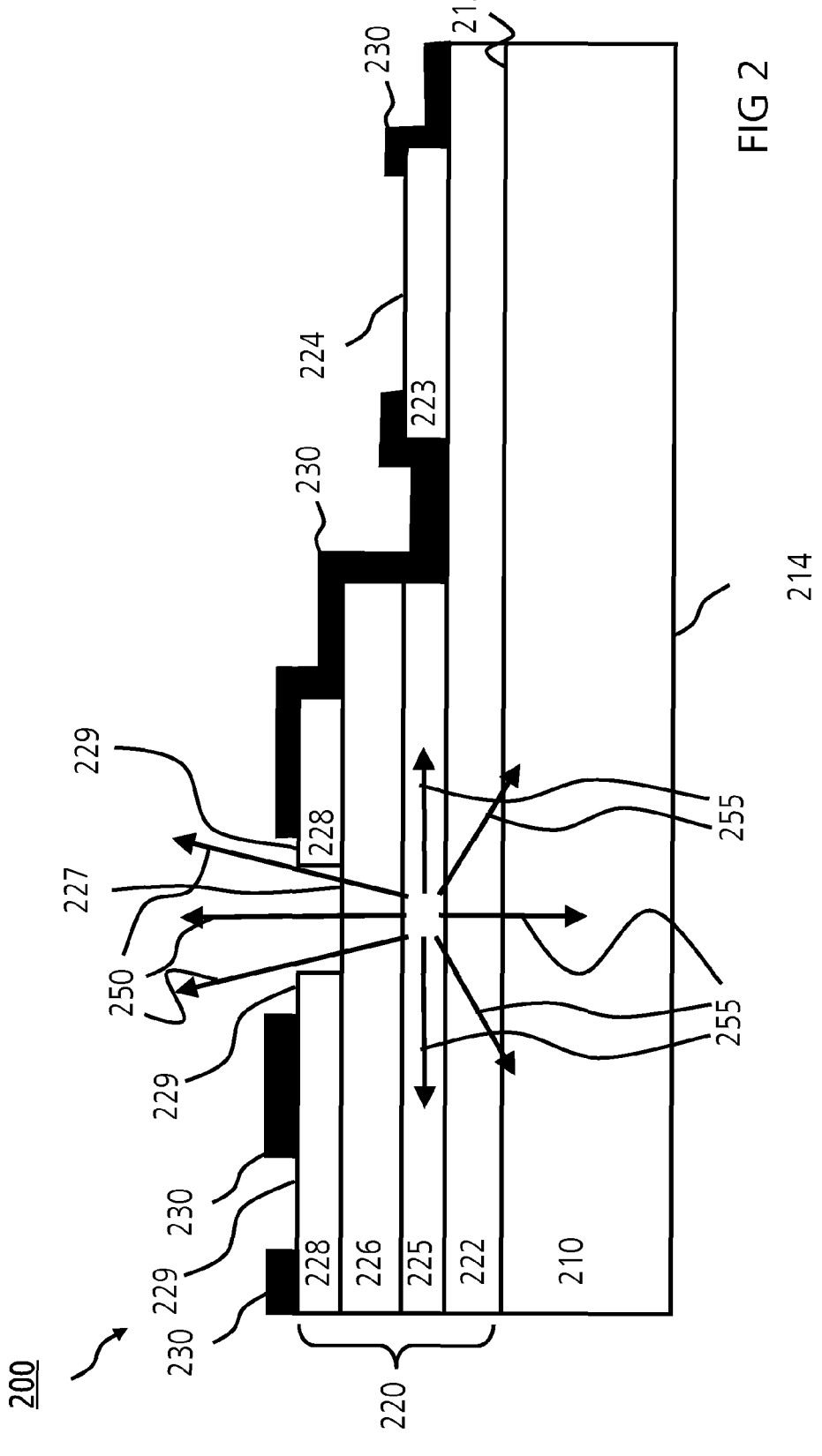
FIG. 2 shows a schematic illustration of an exemplary embodiment of an optical apparatus that is producible using the method.

FIG. 2 shows a schematic illustration of an exemplary embodiment of an optical apparatus 200. In this case, the optical apparatus 200 is designed as a light-emitting diode chip, or LED chip. In this case, the optical apparatus 200 can act as an LED point emitter or LED display. The optical apparatus 200 can be used here in particular for an optical sight, such as a reflector sight, or another optical device.

A substrate 210, for example only an emission device 220, and an absorption material 230 are shown of the optical apparatus 200 in the illustration of FIG. 2 shown as a schematic sectional view here. The emission device 220 is designed to emit electromagnetic radiation. The electromagnetic radiation is, for example, visible light in the spectrum visible to humans or radiation in the spectrum invisible to humans, e.g. infrared. The emission device 220 is designed, for example, as a light-emitting diode (LED). According to another exemplary embodiment, the optical apparatus 200 may include a plurality of emission devices 220.

The substrate 210 is formed from a substrate material that is transparent at least for one emission wavelength of the electromagnetic radiation emitted by the at least one emission device 220. In this case, the substrate is formed in particular from sapphire or gallium nitride. The substrate has a first main surface 212 and a second main surface 214 opposite the first main surface 212. The at least one emission device 220 is arranged on the first main surface 212 of the substrate 210.

An n-doped epitaxial layer 222, an n-contact metal 223, a first electrical connection surface 224, an active emission layer 225, a p-doped epitaxial layer 226, an emission surface 227, a p-contact metal 228, and a second electrical contact surface 229 are shown, merely by way of example, of the at least one emission device 220 in the illustration in FIG. 2. In particular, the at least one emission device 220 is manufactured by means of a semiconductor-technological process. The n-doped epitaxial layer 222 is arranged directly on the first main surface 212 of the substrate 210. The n-contact metal 223, which comprises or acts as the first electrical connection surface 224, and the active emission layer 225 are arranged on the n-doped epitaxial layer 222. The active emission layer 225 is covered with the p-doped epitaxial layer 226. The p-contact metal 228, which comprises or acts as the second electrical connection surface 229, is arranged on the p-doped epitaxial layer 226.

The absorption material 230 is applied on the side of the first main surface 212 of the substrate 210. To put it more precisely, the absorption material 230 is applied on the side of the first main surface 212 in particular to the at least one emission device 220. The absorption material 230 lies at the lowest point on the surface of the n-doped epitaxial layer 222. The absorption material 230 has a colored resist, in particular a solder resist and/or a photostructurable resist. The absorption material 230 absorbs at least the emission wavelength of the electromagnetic radiation emitted by the at least one emission device 220. The emission surface 227 of the at least one emission device 220 is freed from the absorption material 230. Furthermore, the first electrical connection surface 224 and the second electrical connection surface 229 are freed from the absorption material 230. In other words, the absorption material 230 covers the entire apparatus 220 on the side of the first main surface 212 of the substrate 210 with the exception of the emission surface 227 and the first electrical connection surface 224 and the second electrical connection surface 229.

The absorption material 230 is processed in order to lay bare the emission surface 227 and, according to the exemplary embodiment illustrated here, the first electrical connection surface 224 and the second electrical connection surface 229, in particular by means of exposure using a photomask, by means of development and thus removal in the region of the surfaces to be laid bare. In this case, a position determination with regard to the surfaces to be laid bare is carried out from the second main surface 214 of the substrate 210. For this purpose, according to an exemplary embodiment, adjustment marks for the position determination are created on the second main surface 214. According to another exemplary embodiment, the second main surface 214 is polished for this purpose.

The optical apparatus 200 is potted or encapsulated on side edges of the substrate 210 and of the at least one emission device 220 using a potting material, even though the potting material is omitted in the illustration of FIG. 2. The potting material absorbs at least the emission wavelength. Thus, the optical apparatus 200 designed as an LED chip is encased with the absorption material 230 having black resist and the absorbing potting material in order to prevent or minimize stray light or secondary light emissions.

The electromagnetic radiation that is emitted by the at least one emission device 220 is, in particular, visible light or electromagnetic radiation in the spectrum that is visible to humans. However, it can also be radiation that is not visible to humans, such as infrared. A portion of the electromagnetic radiation exits here the apparatus 200 via the emission surface 227 as direct light 250 that exits as intended. The direct light 250 that exits as intended passes from the active emission layer 225 through the p-doped epitaxial layer 226 here. The emission surface 227 represents a portion of a surface of the p-doped epitaxial layer 226 that is free from the p-contact metal 228. A further part of the electromagnetic radiation generated in the active emission layer 225 represents undesired or unwanted direct light 255, which is transported within the apparatus 200 by light guidance or multiple reflection.

In other words, in the optical apparatus 200, a photostructurable resist, which absorbs the emission wavelength of the LED or emission device 220 before and/or after curing, is used as the absorption material 230 selectively for the emission wavelength or for the broadband. Since it is able to be structured at the wafer level, all regions of the LED chip or of the optical apparatus 200, such as the at least one luminous surface or emission surface 227, the fields for wire bonding or the electrical connection surfaces 224 and 229, and optionally singulation boundaries or singulation streets, which will be accessed later in the process, may be left out. The resist can be a black solder resist, for example, which is known from printed circuit board production. In the event that the photostructurable resist is broadband-absorbent during the structuring, the photomask is adjusted from the rear side or second main surface 214 of the substrate 210. For this purpose, the second main surface 214 of the substrate 210 is either polished on the rear side or comprises an adjustment mark aligned with the front side or first main surface 212 in order to achieve correct alignment of the photomask.

Figure 3:
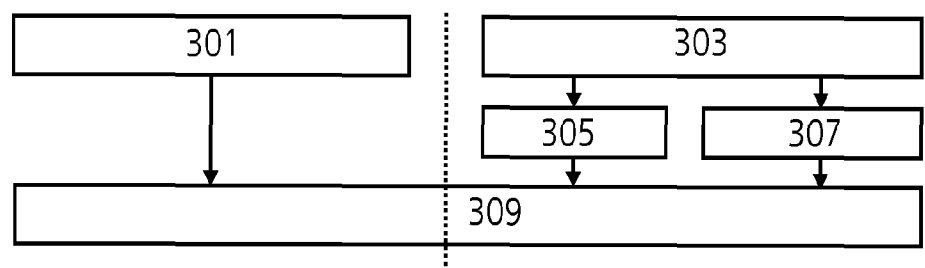
FIG. 3 shows a schematic flowchart of variants of a production process.

FIG. 3 shows a schematic flowchart of variants of a production process. The production process here is part of the method from FIG. 4 or a similar method. According to a first variant of the production process, an epitaxial and structured LED wafer is provided as a substrate with a polished rear side or second main surface in a block 301, and photoresist is applied as an absorption material in a block 309 and structured or processed via rear-side adjustment. According to a second variant of the production process, an epitaxial and structured LED wafer is provided as a substrate without a polished rear side or second main surface in a block 303, an LED wafer rear side or the second main surface is polished in a block 305, and photoresist is applied as absorption material and structured or processed via rear-side adjustment in block 309. According to a third variant of the production process, an epitaxial and structured LED wafer is provided as a substrate without a polished rear side or second main surface in block 303, adjustment marks are applied or created on the wafer rear side or second main surface in a block 307, and photoresist is applied as an absorption material in block 309 and structured or processed via rear-side adjustment.

Figure 4:
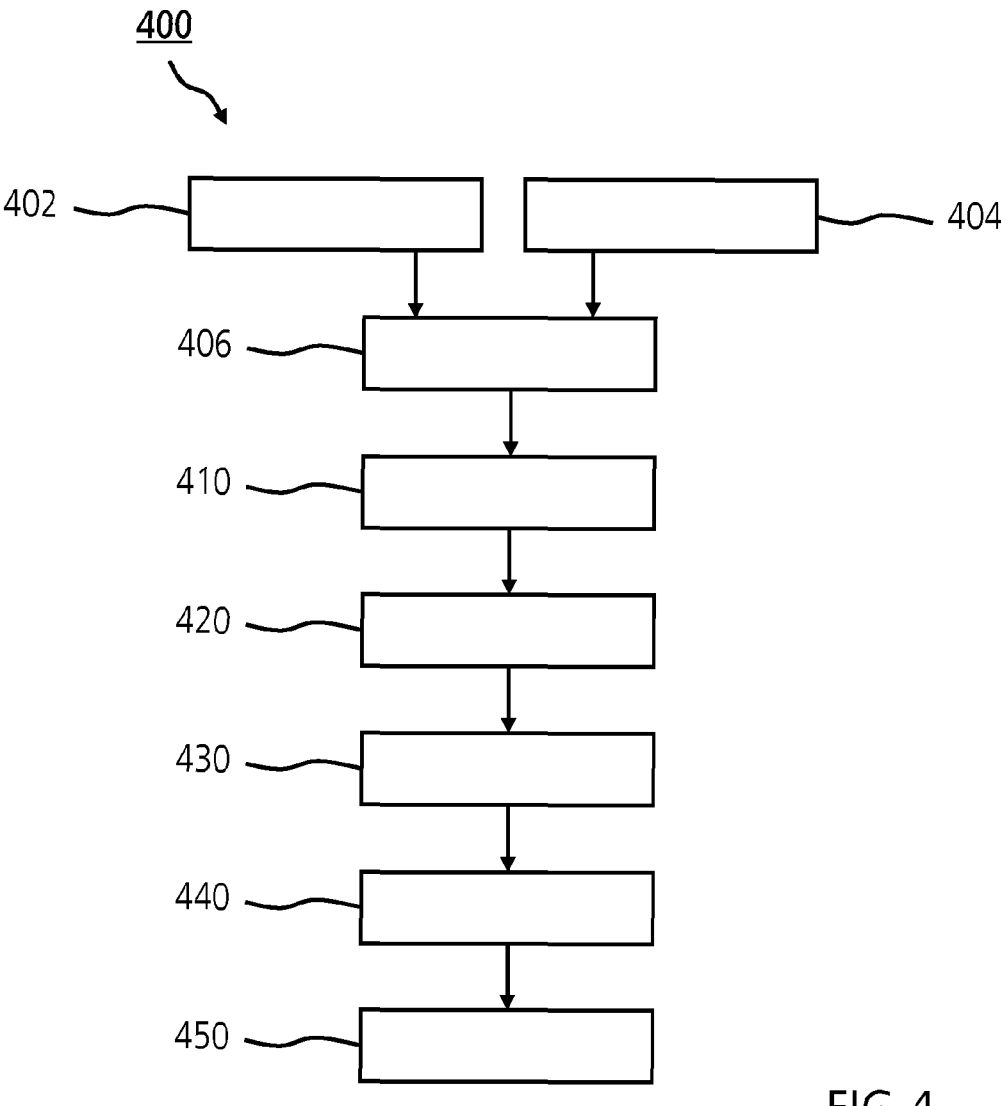
FIG. 4 shows a flowchart of an exemplary embodiment of a method for producing an optical apparatus.

FIG. 4 shows a flowchart of an exemplary embodiment of a method 400 for producing an optical apparatus. The optical apparatus of FIG. 2 or a similar optical apparatus is producible by performing the method 400 for the production.

The method 400 for the production comprises a providing step 410, an application step 420, a processing step 430, and a singulating step 440.

In providing step 410, a substrate is provided on whose first main surface a plurality of emission devices for emitting electromagnetic radiation are arranged and which is transparent at least for one emission wavelength of the radiation emitted by the emission devices. Subsequently, in application step 420, an absorption material which absorbs at least the emission wavelength is applied on the side of the first main surface of the substrate. Again subsequently, in the processing step 430, the absorption material is processed in order to lay bare at least one emission surface of each emission device. In this case, a position determination of surfaces to be laid bare is carried out from a second main surface of the substrate opposite the first main surface. Subsequently, in singulating step 440, the substrate is singulated, by means of a separating manufacturing process, into a plurality of optical apparatuses, each of which has at least one emission device.

In particular, in providing step 410, a substrate is provided which is designed as a light-emitting diode wafer and/or is formed from sapphire or gallium nitride. In particular, in application step 420, an absorption material which has a colored resist is applied, in particular a solder resist and/or photostructurable resist. In particular, in processing step 430, the absorption material is exposed using a photomask, developed using a developer material, and removed at least in the region of the at least one emission surface.

According to one exemplary embodiment, in providing step 410, a substrate with emission devices that are manufactured by means of a semiconductor-technological process is provided. Alternatively, according to one exemplary embodiment, the method 400 for the production comprises a step 406 of manufacturing the emission devices on the substrate by means of a semiconductor-technological process. In this case, the manufacturing step 406 can be carried out before the providing step 410.

According to one exemplary embodiment, in providing step 410, a substrate on whose second main surface adjustment marks for the position determination are created is provided. Alternatively, according to one exemplary embodiment, the method 400 for the production comprises a step 402 of creating adjustment marks for the position determination on the second main surface of the substrate. The creating step 402 can be carried out here before the providing step 410, in particular before the optional manufacturing step 406.

According to another exemplary embodiment, in providing step 410, a substrate whose second main surface is polished is provided. Alternatively, according to one exemplary embodiment, the method 400 for the production comprises a step 404 of polishing the second main surface of the substrate. The polishing step 404 can be carried out here before the providing step 410, in particular before the optional manufacturing step 406.

In particular, in processing step 430, the absorption material is processed in order to also lay bare electrical connection surfaces of each emission device and/or at least one singulation boundary. In singulating step 440, the substrate is separated into the plurality of optical apparatuses along the at least one singulation boundary.

According to an exemplary embodiment, the method 400 for the production comprises a step 450 of potting side edges of the substrate of each optical apparatus using a potting material after the step of singulating the substrate. In this case, the potting material absorbs at least the emission wavelength. The potting step 450 can be carried out after the singulating step 440.

The invention claimed is:

1. A method for producing an optical apparatus, wherein the method has the following steps:

providing a substrate on whose first main surface a plurality of emission devices for emitting electromagnetic radiation are arranged, wherein the substrate is designed as a light-emitting diode wafer and/or the substrate is formed from sapphire or gallium nitride, and wherein the substrate is transparent at least for one emission wavelength of the radiation emitted by the emission devices;

applying an absorption material on the side of the first main surface of the substrate, wherein the absorption material has a photostructurable resist which absorbs at least the emission wavelength;

processing the absorption material in order to lay bare at least one emission surface of each emission device, wherein a position determination of surfaces to be laid bare is carried out from a second main surface of the substrate opposite the first main surface; and singulating the substrate into a plurality of optical apparatuses by means of a separating manufacturing process, wherein each optical apparatus has at least one emission device.

2. The method as claimed in claim 1, wherein, in the processing step, the absorption material is exposed using a photomask, is developed using a developer material, and is removed at least in the region of the at least one emission surface.

3. The method as claimed in claim 1, wherein, in the processing step, the absorption material is processed in order to lay bare electrical connection surfaces of each emission device and/or at least one singulation boundary.

4. The method as claimed in claim 1, wherein, in the providing step, a substrate is provided on whose second main surface adjustment marks for the position determination are created, or characterized by a step of creating adjustment marks for the position determination on the second main surface of the substrate.

5. The method as claimed in claim 1, wherein, in the providing step, a substrate is provided, whose second main surface is polished, or characterized by a step of polishing the second main surface of the substrate.

6. The method as claimed in claim 1, wherein a step of potting side edges of the substrate of each optical apparatus using a potting material after the step of singulating the substrate, wherein the potting material absorbs at least the emission wavelength.

7. The method as claimed in claim 1, wherein, in the providing step, a substrate with emission devices is provided, which are manufactured by means of a semiconductor-technological process, or characterized by a step of fabricating the emission devices on the substrate by means of a semiconductor-technological process, wherein in the semiconductor-technological process an n-doped epitaxial layer is arranged on the first main surface of the substrate, an n-contact metal as a first electrical connection surface and an active emission layer are arranged on the n-doped epitaxial layer, the active emission layer is covered with a p-doped epitaxial layer, and a p-contact metal is arranged as a second electrical connection surface on the p-doped epitaxial layer.

\* \* \* \* \*